United States Patent
Stoehr et al.

(10) Patent No.: US 6,534,417 B2
(45) Date of Patent: *Mar. 18, 2003

(54) METHOD AND APPARATUS FOR ETCHING PHOTOMASKS

(75) Inventors: Brigitte C. Stoehr, San Jose, CA (US); Michael D. Welch, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/126,851

(22) Filed: Apr. 19, 2002

(65) Prior Publication Data

US 2002/0155725 A1 Oct. 24, 2002

Related U.S. Application Data

(63) Continuation of application No. 09/625,343, filed on Jul. 25, 2000, now Pat. No. 6,391,790.

(51) Int. Cl.[7] ............................................... H01L 21/00
(52) U.S. Cl. ..................... 438/715; 438/720; 438/723; 438/742; 438/724; 438/744
(58) Field of Search ................... 430/316, 318, 430/323; 438/715, 719, 720, 721, 723, 725, 724, 742, 743, 744; 216/67, 75, 79

(56) References Cited

U.S. PATENT DOCUMENTS

| 4,310,380 A | 1/1982 | Flamm et al. ............... 156/643 |
| 4,484,978 A | 11/1984 | Keyser ......................... 156/643 |
| 4,666,555 A | 5/1987 | Tsang ........................... 156/643 |
| 4,713,141 A | 12/1987 | Tsang ........................... 156/643 |
| 4,726,879 A | 2/1988 | Bondur et al. ............... 156/643 |
| 4,741,799 A | 5/1988 | Chen et al. .................. 156/643 |
| 5,110,408 A | 5/1992 | Fujii et al. ................... 156/643 |

(List continued on next page.)

FOREIGN PATENT DOCUMENTS

| DE | 27 01 458 A1 | 7/1977 |
| EP | 0 489 407 A2 | 6/1992 |
| EP | 0 552 491 A1 | 7/1993 |
| JP | 60-219748 | 11/1985 |
| JP | 62-181433 | 8/1987 |
| JP | 09-082686 | 3/1997 |
| WO | 01/96955 | 12/2001 |

OTHER PUBLICATIONS

Pan, et al., "Selective reactive ion etching of tungsten films in $CHF_3$ and other fluorinated gases", *J. Vac. Sci. and Tech. B*, 6(4), (Jul./Aug. 1988), pp. 1073–1080.

Theisen, et al., "Maskless Tungsten Etch Process for Plug Fill", *1046b Extended Abstracts*, Electrochem Soc., Spring Meeting, 90(1) (May 6–11, 1990), pp. 248–249.

*Primary Examiner*—William A. Powell
(74) *Attorney, Agent, or Firm*—Moser Patterson & Sheridan

(57) ABSTRACT

A process is provided for etching a silicon based material in a substrate, such as a photomask, to form features with straight sidewalls, flat bottoms, and high profile angles between the sidewalls and bottom, and minimizing the formation of polymer deposits on the substrate. In the etching process, the substrate is positioned in a processing chamber, a processing gas comprising a fluorocarbon, which advantageously is a hydrogen free fluorocarbon, is introduced into the processing chamber, wherein the substrate is maintained at a reduced temperature, and the processing gas is excited into a plasma state at a reduced power level to etch the silicon based material of the substrate. The processing gas may further comprise an inert gas, such as argon.

40 Claims, 3 Drawing Sheets

U.S. PATENT DOCUMENTS

| | | | |
|---|---|---|---|
| 5,164,330 A | 11/1992 | Davis et al. | 437/192 |
| 5,242,538 A | 9/1993 | Hamrah et al. | 156/643 |
| 5,316,616 A | 5/1994 | Nakamura et al. | 156/643 |
| 5,358,601 A | 10/1994 | Cathey | 156/656 |
| 5,429,070 A | 7/1995 | Campbell et al. | 118/723 R |
| 5,433,823 A | 7/1995 | Cain | 156/662.1 |
| 5,458,734 A | 10/1995 | Tsukamoto | 156/643.1 |
| 5,486,706 A | 1/1996 | Yuki et al. | 257/25 |
| 5,571,366 A | 11/1996 | Ishii et al. | 156/345 |
| 5,643,473 A | 7/1997 | Tachi et al. | 216/67 |
| 5,658,472 A | 8/1997 | Bartha et al. | 216/2 |
| 5,705,025 A | 1/1998 | Dietrich et al. | 156/643.1 |
| 5,759,921 A | 6/1998 | Rostoker | 438/711 |
| 5,767,021 A | 6/1998 | Imai et al. | 438/719 |
| 5,843,847 A | 12/1998 | Pu et al. | 438/723 |
| 5,854,136 A | 12/1998 | Huang et al. | 438/714 |
| 5,880,033 A | 3/1999 | Tsai | 438/710 |
| 5,899,749 A | 5/1999 | Becker et al. | 438/714 |
| 5,900,163 A | 5/1999 | Yi et al. | 216/79 |
| 5,933,729 A | 8/1999 | Chan | 438/257 |
| 5,965,463 A | 10/1999 | Cui et al. | 438/723 |
| 5,994,160 A | 11/1999 | Niedermann et al. | 438/53 |
| 5,994,235 A | 11/1999 | O'Donnel | 438/720 |
| 6,025,271 A | 2/2000 | Howard et al. | 438/697 |
| 6,037,265 A | 3/2000 | Mui et al. | 438/719 |
| 6,080,529 A | 6/2000 | Ye et al. | 430/318 |
| 6,221,784 B1 | 4/2001 | Schmidt et al. | 438/719 |
| 6,277,763 B1 | 8/2001 | Kugimiyama et al. | 438/720 |
| 6,312,616 B1 | 11/2001 | Chinn et al. | 216/68 |
| 6,391,790 B1 * | 5/2002 | Stoehr et al. | 438/715 |

OTHER PUBLICATIONS

Ootera, et al., "Highly Selective Etching of W/WN/Poly–Si Gate on Thin Oxide Film With Gaspuff Plasmas", Proc. of Symp.on Dry Process (Nov. 11–12, 1999), pp. 155–160.

Hayashi, et al., $SiO_2$ Etching Using Inductively Coupled Plasma, *Electronics & Communications in Japan*, Part 2, 81(9) (1998), pp. 21–28.

Kaplita, et al., "Polysilicon planarization and plug recess etching in decoupled plasma source chamber using two endpoint techniques", The SPIE Conf. on Process, Equipment & Materials Control, vol. 3882 (Sep. 1999), pp. 90–97.

International Search Report for PCT/US01/19282, dated May 31, 2002.

* cited by examiner

METHOD AND APPARATUS FOR ETCHING PHOTOMASKS

This is a continuation Ser. No. 09/625,343 filed on Jul. 25, 2000, now U.S. Pat. No. 6,391,790 which claims priority of Ser. No. 60/206,230 filed May 22, 2000.

BACKGROUND OF THE INVENTION

1. Field of the Invention

The invention relates to the fabrication of integrated circuits and to the fabrication of photomasks useful in the manufacture of integrated circuits.

2. Background of the Related Art

Semiconductor device geometries have dramatically decreased in size since such devices were first introduced several decades ago. Since then, integrated circuits have generally followed the two year/half-size rule (often called Moore's Law), which means that the number of devices on a chip doubles every two years. Today's fabrication plants are routinely producing devices having 0.35 $\mu$m and even 0.18 $\mu$m feature sizes, and tomorrow's plants soon will be producing devices having even smaller geometries.

The increasing circuit densities have placed additional demands on processes used to fabricate semiconductor devices. For example, as circuit densities increase, the widths of vias, contacts and other features, as well as the dielectric materials between them, decrease to sub-micron dimensions, whereas the thickness of the dielectric layers remains substantially constant, with the result that the aspect ratios for the features, i.e., their height divided by width, increases. Reliable formation of high aspect ratio features is important to the success of sub-micron technology and to the continued effort to increase circuit density and quality of individual substrates and die. High aspect ratio features are conventionally formed by patterning a surface of a substrate to define the dimensions of the features and then etching the substrate to remove the substrate material. Consequently, reliable formation of high aspect ratio features requires a precise patterning and etching of the substrate.

Photolithography is a technique used to form precise patterns on substrates to be etched to form the desired devices or features. Generally, photolithography techniques use light patterns to expose photoresist materials deposited on a substrate surface to develop precise patterns on the substrate surface prior to the etching process. In conventional photolithographic processes, a photoresist is applied on the material to be etched, and the features to be etched in the material, such as contacts, vias, or interconnects, are defined by exposing the photoresist to a pattern of light through a photolithographic photomask which corresponds to the desired configuration of features. A light source emitting ultraviolet (UV) light, for example, may be used to expose the photoresist to chemically alter the composition of the photoresist. The altered or the unaltered photoresist material is then removed by chemical processes to expose the underlying material of the substrate while the retained photoresist material remains as a protective coating. Once the desired photoresist material is removed to form the desired pattern in the photoresist, the exposed underlying material is then etched to form the features in the substrate surface.

Photolithographic photomasks, or reticles, typically include a substrate made of an optically transparent silicon based material, such as quartz (i.e., silicon dioxide, $SiO_2$), having an opaque light-shielding layer of metal, typically chromium, patterned on the surface of the substrate. The metal layer is patterned to form features which define the pattern and correspond to the dimensions of the features to be transferred to the substrate. Generally, conventional photomasks are fabricated by first depositing a thin layer of metal on a substrate comprising an optically transparent silicon based material, such as quartz, and depositing a photoresist layer on the thin metal layer. The photoresist is then patterned using conventional patterning techniques. The metal layer is etched to remove material not protected by the photoresist, thereby exposing the underlying silicon based material.

In order to achieve current circuit densities, alternating phase shift photomasks are being used to increase the precision of the etching pattern formed on the substrate by increasing the resolution of the light passing through the photomask. Alternating phase shift photomasks are fabricated by the same method described above, but with the additional step of etching the exposed silicon based material to form features that refract the light passing therethrough by one half-wavelength. The half-wavelength light has a greater intensity and improved resolution over the unmodified light, thereby allowing the formation of more precise patterns on the underlying substrate. The refraction of light to produce a proportionally shortened wavelength is based on the composition and thickness of the substrate, and the photomask features are etched into the silicon based material to change the thickness of the material the light passes through, and thus change the wavelength of the light. To modify the light to produce the desired wavelength, the etched features formed in the silicon based material of the substrate must be precisely formed in the substrate with a minimal amount of defects in the feature structure.

Current etching processes for silicon based materials, such as those materials used for dielectric layers in semiconductor manufacturing, have proven unsuitable for etching features in photomasks. For example, the required processing temperatures, or thermal budgets, of materials, such as photoresists, used in photomask fabrication, are lower than the temperatures experienced in conventional dielectric etching processes. If the thermal budget is exceeded during etching of the photomask, the photoresist layer can detrimentally deteriorate, and consequently cause imprecise features to be etched in the underlying silicon based material, resulting in the formation of defective photomasks.

Additionally, current etch chemistries, such as a mixture of $CHF_3$ and oxygen, used to etch silicon based substrates in photomask fabrication have not produced quality photomasks because the chemistry and the processing conditions have not been able to achieve acceptable feature structure. High quality photomasks require features etched in the silicon based material to have straight sidewalls, a flat bottom, and a angle between the sidewalls and the bottom of the feature, which is referred to as a profile angle, between about 85° and about 90°. If the profile angle is formed with unacceptable tolerances, i.e., angles of less than about 85°, the properties of the light passing through the feature may be detrimentally affected, such as having a less than desirable light resolution, and produce less than desired patterning of the underlying substrate.

One difficulty with achieving acceptable feature structure by current etch chemistries and processing conditions occurs when the $CHF_3$ processing gas produces plasma radicals, such as $CHF_2$, which can polymerize and form deposits on the surfaces of the features formed in the silicon based material of the photomask or on the processing chambers surfaces. The polymer deposits may then flake and produce a particle problem in the chamber and in the etched features. Particle deposition in the features can interfere with the etching process and result in imprecisely formed features. Particle deposition in the features after etching can also lead to interference with the light passing therethrough to produce numerous patterning defects in the subsequent photolithograpic processing of substrates.

Polymer deposits may also form on the inner surfaces of the features, and prevent consistent etching of the features, particularly on the bottom and lower sidewalls of high aspect ratio features. In order to etch the silicon based material of the substrate, the etch process first removes any polymer deposits formed thereon prior to etching the underlying silicon based material. The etching interference caused by the deposited polymers, or passivating deposits, can result in features formed with undesirable structures. For example, it has been observed that the current etch chemistries and processing conditions for etching silicon base materials produce features with uneven or tapering sidewalls, feature bottoms which are convex, concave, or have rough surfaces, and profile angles of less than 85°. Such features detrimentally affect the light passing therethrough which can result in imprecise patterning by the photomask.

The polymer deposits may also detrimentally affect the etching rate of the silicon based materials in comparison to the etching rate of the photoresist materials to produce imprecisely formed features. The etching rate, or removal rate, of one material in contrast to another material is often described as the selectivity of the process to the materials. Polymer deposits formed on the surfaces of the silicon material are etched from the surface of the features prior to the underlying silicon, thereby resulting in the silicon material being etched at a slower rate than would normally occur. A lower etching rate of the silicon material having polymer deposits formed thereon in comparison to the photoresist material etch rate corresponds to a lower selectivity. The effect of a lower selectivity is the premature removal of photoresist material which may produce features which are not etched to the desired dimensions, or which may have tapered dimensions or rounded corners at the top and bottom of the feature. The imprecisely formed features can detrimentally affect the resolution and optical performance of light passing therethrough.

Therefore, there remains a need for a photomask etching chemistry and process which limits polymer formation, minimizes defect formation, and forms features with straight sidewalls, flat, even bottoms, and high profile angles. It would also be desirable if the process provided improved etch selectivity.

SUMMARY OF THE INVENTION

The invention generally provides a method for etching a substrate, such as a photomask comprising a silicon based material. In one aspect, a method is provided for etching a substrate comprising placing the substrate on a support member in a processing chamber where the substrate comprises a silicon based material and is maintained at a temperature between about 50° C. and about 150° C., introducing a processing gas comprising one or more hydrogen free fluorocarbons into the processing chamber, delivering power to the processing chamber to generate a plasma by supplying a source RF power between about 50 Watts and about 200 Watts to a coil and supplying a bias power to the support member between about 50 Watts and about 200 Watts, and etching exposed portions of the silicon based material.

In another aspect, a method is provided for etching a substrate comprising a patterned silicon based material. The method comprises placing the substrate in a processing chamber on a support member, wherein the substrate is maintained at a temperature of less than about 150° C., introducing a processing gas comprising one or more fluorocarbons having the formula $C_xF_y$ into the processing chamber, where x is an integer from 1 to 5 and y is an integer from 4 to 8, delivering power to the processing chamber by supplying a source RF power of about 200 Watts or less to a coil and supplying a bias power to the support member of about 200 Watts or less to generate a plasma, and etching exposed portions of the silicon based material.

In another aspect, a method is provided for etching a photomask comprising a quartz substrate, a patterned metal layer over the photomask, and a patterned photoresist layer over the metal layer. The method comprises placing the photomask on a support member in a processing chamber while maintaining the photomask at a temperature of about 150° C. or less, introducing a processing gas selected from the group of $CF_4$, $C_2F_6$, $C_4F_6$, $C_3F_8$, $C_4F_8$, $C_5F_8$ into the processing chamber, supplying a source RF power of about 200 watts or less to generate a plasma in the processing chamber, and etching exposed portions of the quartz substrate.

In another aspect, a method is provided for etching a substrate comprising quartz, a patterned metal layer deposited on the quartz, and a patterned resist material deposited on the patterned metal layer. The method comprises placing the substrate on a support member in a processing chamber, introducing a processing gas comprising one or more fluorocarbon gases into the processing chamber, delivering power to the processing chamber by supplying a source RF power of about 200 Watts or less to a coil and supplying a bias power to the support member of about 200 Watts or less to generate a plasma, and etching exposed portions of the quartz.

BRIEF DESCRIPTION OF THE DRAWINGS

So that the manner in which the above recited features, advantages and objects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The invention will be described below in reference to an inductively coupled plasma etch chamber, such as a Decoupled Plasma Source, or DPS™, chamber manufactured by Applied Materials, Inc., of Santa Clara, Calif. Other process chambers may be used to perform the processes of the invention, including, for example, capacitively coupled parallel plate chambers and magnetically enhanced ion etch chambers as well as inductively coupled plasma etch chambers of different designs. Although the processes are advantageously performed with the DPS™ processing chamber, the description in conjunction with the DPS™ processing chamber is illustrative, and should not be used to limit the scope of the invention.

Figure 1:
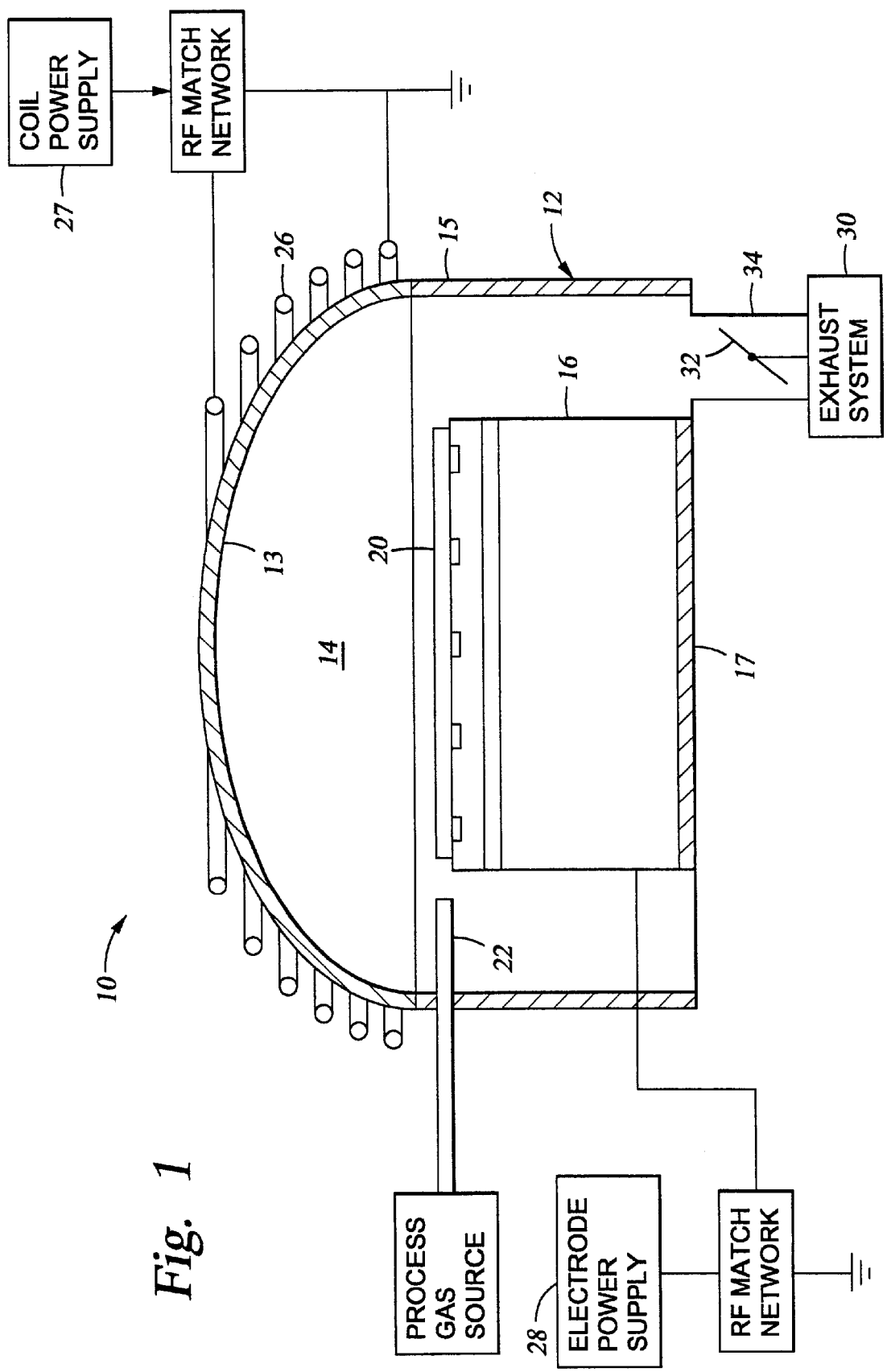
FIG. 1 is a schematic view of an exemplary etching chamber for use with the processes described herein.

FIG. 1 is a schematic cross sectional view of one embodiment of a DPS™ processing chamber which may be used for performing the processes described herein. The processing chamber 10 generally includes a cylindrical sidewall or chamber body 12, an energy transparent dome ceiling 13 mounted on the body 12, and a chamber bottom 17. An inductive coil 26 is disposed around at least a portion of the dome 13. The chamber body 12 and chamber bottom 17 of the processing chamber 10 can be made of a metal, such as anodized aluminum, and the dome 13 can be made of an energy transparent material such as a ceramic or other dielectric material. A substrate support member 16 is disposed in the processing chamber 10 to support a substrate 20 during processing. The support member 16 may by a conventional mechanical or electrostatic chuck with at least a portion of the support member 16 being electrically conductive and capable of serving as a process bias cathode. A plasma zone 14 is defined by the process chamber 10, the substrate support member 16 and the dome 13.

Processing gases are introduced into the processing chamber 10 through a gas distributor 22 peripherally disposed about the support member 16. A plasma is formed from the processing gases using a coil power supply 27 which supplies power to the inductor coil 26 to generate an electromagnetic field in the plasma zone 14. The support member 16 includes an electrode disposed therein which is powered by an electrode power supply 28 and generates a capacitive electric field in the processing chamber 10. Typically, RF power is applied to the electrode in the support member 16 while the body 12 is electrically grounded. The capacitive electric field is transverse to the plane of the support member 16, and influences the directionality of charged species more normal to the substrate 20 to provide more vertically oriented anisotropic etching of the substrate 20.

Process gases and etchant byproducts are exhausted from the process chamber 10 through an exhaust system 30. The exhaust system 30 may be disposed in the bottom 17 of the processing chamber 10 or may be disposed in the body 12 of the processing chamber 10 for removal of processing gases. A throttle valve 32 is provided in an exhaust port 34 for controlling the pressure in the processing chamber 10. An optical endpoint measurement device can be connected to the processing chamber 10 to determine the endpoint of a process performed in the chamber.

Exemplary Etch Process

A silicon based substrate, such as quartz, used in manufacturing photomasks is etched to produce features having straight vertical sidewall definition with sharp angled profiles and a flat feature bottom. A processing gas comprising fluorocarbon gases are used. Advantageously, the fluorocarbon gases are hydrogen free fluorocarbons. The fluorocarbons can have from 1 to 5 atoms of carbon and from 4 to 8 atoms of fluorine is used to reduce the formation of polymer deposits on the substrate surface. Examples of hydrogen free fluorocarbon gases include $CF_4$, $C_2F_6$, $C_4F_6$, $C_3F_8$, $C_4F_8$, $C_5F_8$, and combinations thereof. The processing gas may also include an inert gas which when ionized as part of the plasma comprising the processing gas results in sputtering species to increase the etching rate of the features. The presence of an inert gas as part of the plasma may also enhance dissociation of the processing gas. Examples of inert gases include argon, helium, neon, xenon, and krypton, and combinations thereof. The use of the processing gas in the etching process will now be described.

In one embodiment, the substrate is maintained at a temperature between about 50° C. and about 150° C. during etching of the substrate. Heat degradation of materials, such as photoresist materials, deposited on the substrate during the photomask fabrication process are minimized. It is also believed that the substrate temperature also minimizes polymer formation on the substrate during the etching process. Additionally, the sidewalls of the processing chamber are maintained at a temperature of less than about 70° C. and the dome is maintained at a temperature of less than about 80° C. to maintain consistent processing conditions and to minimize polymer formation on the surfaces of the processing chamber.

A source RF power level between about 50 watts and about 200 watts is applied to an inductor coil to generate and sustain the plasma of the processing gases during the etching process. The source RF power level produces sufficient radicals from the processing gases to etch the exposed silicon based material of the substrate while providing a sufficiently low power level to minimize the formation of polymer radicals formed in the plasma during the etching process. A bias power between about 50 watts and about 200 watts is also applied to the substrate support to enhance control of the etching process by providing increased directionality of the etching radicals with respect to the surface of the substrate.

Further, the power levels used during the etching process are sufficiently low compared to prior art silicon etch processes to maintain the substrate at temperatures between about 50° C. and about 150° C. It is believed that generating a plasma of the processing gases at reduced power levels and reduced substrate temperatures removes exposed silicon based material and prevents photoresist degradation to produce features in the silicon based material having straight sidewalls and flat bottoms, with the sidewalls of the etched features forming profile angles of at least about 85° with the bottom surface of the feature. It is also believed that the power levels provide improved selectivity and substantially maintains the critical dimensions of the features being etched.

Figure 2:
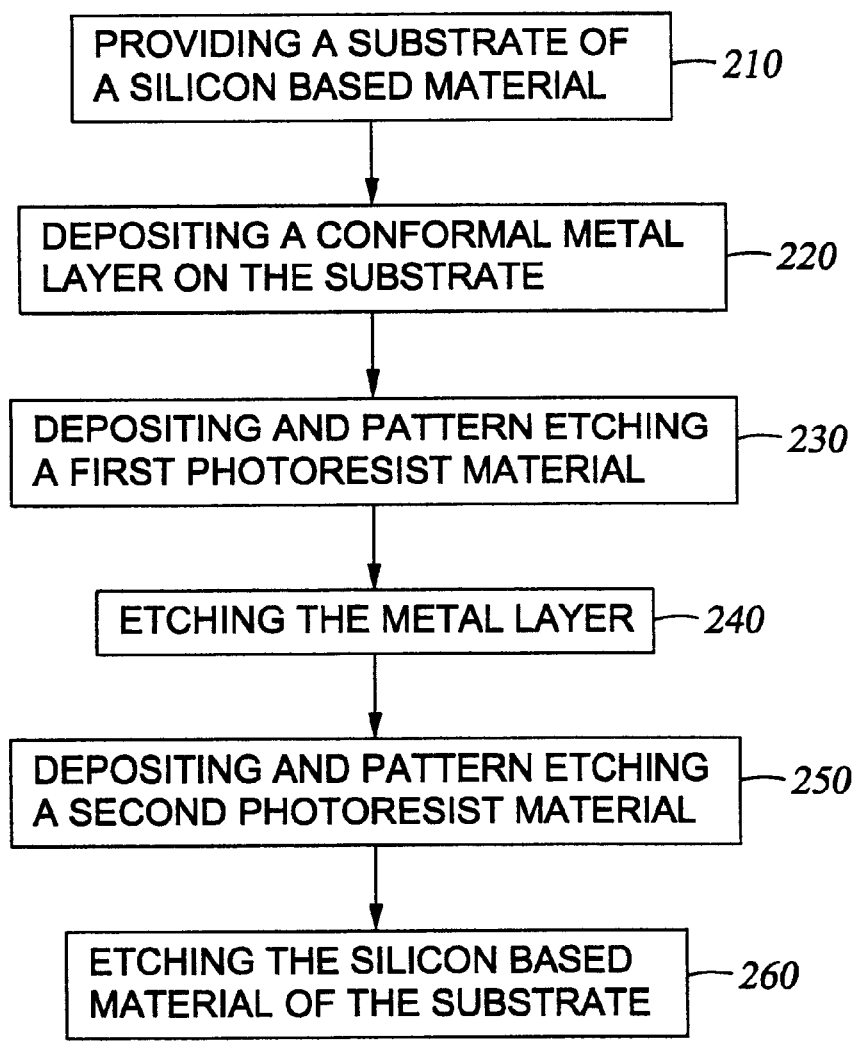
FIG. 2 is a flow chart illustrating a sequence for processing a substrate according to one embodiment of the invention.

FIG. 2 is a flow chart of one embodiment of one process sequence of the invention. The flow chart is provided for illustrative purposes and should not be construed as limiting the scope of the invention. A substrate, typically comprising a silicon based material, such as optical quality quartz or molybdenum silicide, is provided 200 to a processing chamber, such as the DPS™ processing chamber 10 of FIG. 1. The substrate is then processed by depositing an opaque, conformal metal layer, typically chromium, on the substrate 220. The dimensions of features to be formed in the metal layer are patterned by depositing and pattern etching a first photoresist material 230 to expose the conformal metal layer. The photoresist materials used in photomask fabrication are usually low temperature photomask materials, which is defined herein as a photomask material which thermally degrades at a temperature below about 250° C.

Features are then formed in the substrate by etching the conformal metal layer 240 to expose the underlying substrate. The photoresist material remaining after etching the conformal metal layer is usually then removed. The silicon based material of the substrate is prepared for etching by depositing and pattern etching a second photoresist material 250 to expose the substrate. The substrate is then transferred to a DPS™ processing chamber where a processing gas containing fluorocarbon gases is introduced into the processing chamber and a plasma is generated, thereby etching 260 the exposed silicon based material of the substrate.

Figure 3A:
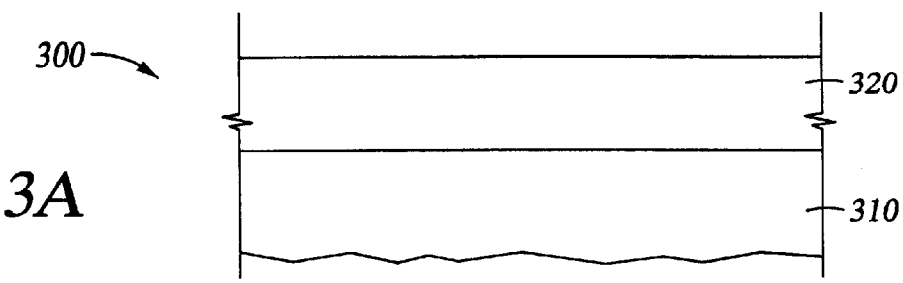
FIGS. 3A–3E are cross sectional views showing an etching sequence of one embodiment of the invention.
Figure 3B:
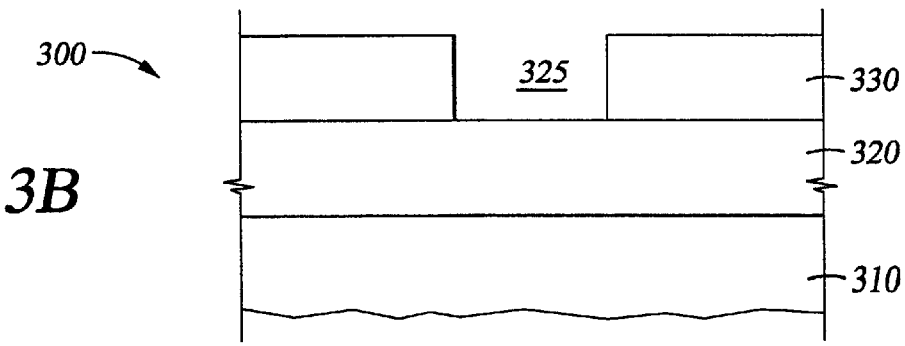

FIGS. 3A–3E illustrate the composition of the photomask prior to the etching steps as well as further illustrate the process described above in FIG. 2. A substrate 300 made of optical quality quartz material 310 is introduced into a processing chamber and a metal layer 320 made of chromium is deposited thereon as shown in FIG. 3A. The chromium layer may be deposited by conventional methods known in the art, such as by physical vapor deposition (PVD) or chemical vapor deposition (CVD) techniques. The chromium layer 320 is typically deposited to a depth of approximately 200 nanometers (nm) thick, however, the depth of the layer may change based upon the requirements of the manufacturer and the composition of the materials of the substrate or metal layer. Referring to FIG. 3B, the substrate 300 is then transferred to another processing chamber where a layer of photoresist material 330, such as "RISTON," manufactured by duPont de Nemours Chemical Company, is deposited upon the chromium layer 320. The resist material 330 is then pattern etched using conventional laser or electron beam patterning equipment to form features 325 which are used to define the dimensions of the features to be formed in the chromium layer 320.

Figure 3C:
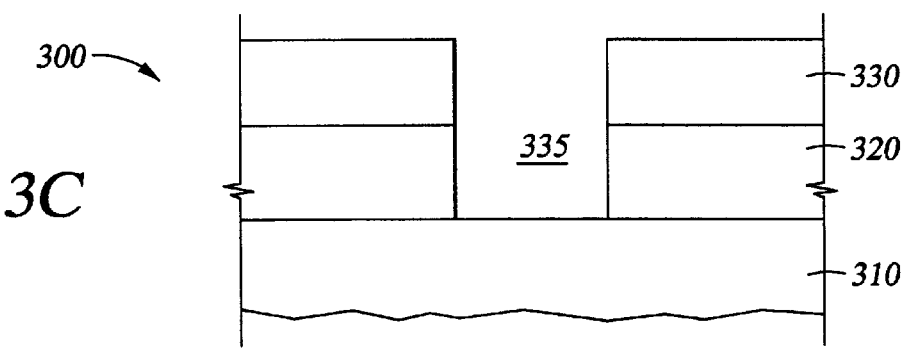
Figure 3D:
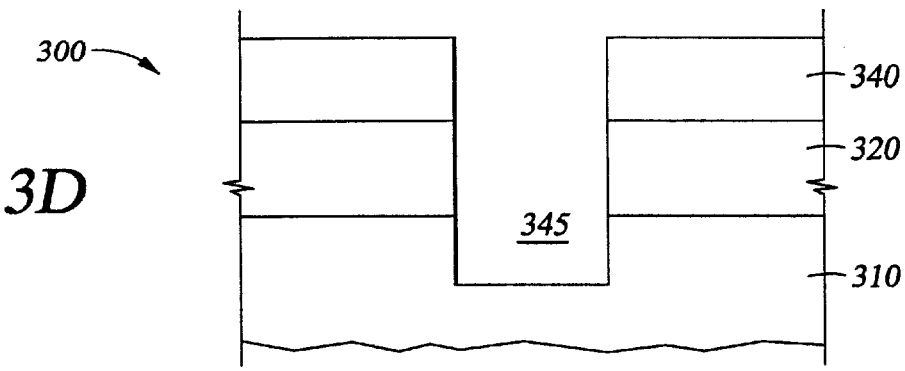

The substrate 300 is then transferred to an etch chamber and the chromium layer 320 is etched using metal etching techniques known in the art or by new metal etching techniques that may be developed to form features 335 which expose the underlying quartz material 310 as shown in FIG. 3C. After etching of the chromium layer 320 is completed, the substrate 300 is transferred to a processing chamber, and the remaining photoresist material 330 is usually removed from the substrate 300, such as by an oxygen plasma process, or other resist removal technique known in the art. A second photoresist material 340 is then applied and patterned to expose the underlying quartz material 310 within the features 335 as shown in FIG. 3C. The photoresist material 340 is deposited to a depth of about 200 nm thick, but may be of any thickness and is preferably of at least the same thickness as the depth of the features to be etched in the quartz material 310 to form the photomask. The patterned substrate 300 is then transferred to an etch chamber, such as the DPS™ processing chamber 10, for plasma etching the quartz material 310.

Once placed on the support member 16, a processing gas is introduced into the chamber and a plasma is generated to etch the quartz material 310 of the substrate 300. Advantageously, fluorocarbon gases are hydrogen free fluorocarbons such as $CF_4$, $C_2F_6$, $C_4F_6$, $C_3F_8$, $C_4F_8$, $C_5F_8$, and combinations thereof. A plasma of the fluorocarbon gases produces fluorine-containing species that etch the quartz material 310 on the substrate 300 without the presence of an oxidizing gas. The fluorine containing species of the plasma react with the quartz material 310 to form volatile $SiF_x$ species that are exhausted from the processing chamber 10. It has also been determined that the fluorocarbon gases etch the silicon material at an etching rate greater than an etching rate of resist materials. The processing gas may also include an inert gas including argon, helium, neon, xenon, and krypton, and combinations thereof to improve the etching process.

The fluorocarbon gases, and advantageously the hydrogen free fluorocarbons, have been observed to be well suited for etching other silicon based materials, such as molybdenum silicide (MoSi) and molybdenum silicon oxynitride (MoSiON), used in photomask manufacturing. Further, it is contemplated that the etch chemistry and the processing conditions may also be used to etch dielectric layers containing silicon, such as silicon oxide, titanium silicide, and silicon nitride, as well as other silicon based materials, such as undoped silicate glass, phosphosilicate glass, and borophosphatesilicate glass, which are used in semiconductor manufacturing.

An exemplary processing regime for etching substrates with a processing gas comprising fluorocarbon gases is as follows. The processing gas comprising the fluorocarbon gases is introduced into a processing chamber, such as the DPS™ described above, at a flow rate between about 25 sccm and about 100 sccm. In one embodiment, processing gas is introduced into a processing chamber at a flow rate between about 25 sccm and about 50 sccm. The chamber is maintained at a pressure between about 2 milliTorr and about 50 milliTorr. In one embodiment, the pressure is maintained between about 2 milliTorr and about 10 milliTorr. In another embodiment, the pressure is maintained between about 2 milliTorr and about 6 milliTorr. If an inert gas is used to enhance the etching process, the inert gas is introduced into the processing chamber at a flow rate between about 30 sccm and about 150 sccm. In one embodiment, the inert gas is introduced into the processing chamber at a flow rate of about 50 sccm.

A source RF power between about 50 watts and about 200 watts is applied to an inductor coil to generate and sustain the plasma during the process. In one embodiment, a source RF power level of between about 50 watts and 100 watts is applied to the inductor coil. A bias power level between about 50 watts and about 200 watts is applied to the substrate support to enhance control of the etching process. In one embodiment, a bias power level of between about 100 watts and about 200 watts is applied to the substrate support.

During the etching process, the substrate is maintained at a temperature between about 50° C. and about 150° C. Additionally, the sidewalls 15 of the processing chamber 10 are maintained at a temperature of less than about 70° C. and the dome is maintained at a temperature of less than about 80° C. to maintain consistent processing conditions and to minimize polymer formation on the surfaces of the processing chamber. Under the above described processing regime parameters, the quartz material 310, or other silicon based materials, can be etched at a rate between about 200 Å/min and about 1000 Å/min depending on the composition of the processing gas and construction of the processing chamber.

In one embodiment of the invention, a processing gas comprising $C_2F_6$ is introduced into a processing chamber at a flow rate of about 25 sccm and the processing chamber is maintained at a pressure of about 6 Torr. A source RF power of about 100 watts is applied to an inductor coil to generate and sustain the plasma during the process with a bias power of about 200 watts applied to the substrate support to enhance control of the etching process. The substrate is maintained at a temperature between about 50° C. and about 80° C. with the sidewalls of the processing chamber maintained at a temperature of about 70° C. and the dome is maintained at a temperature of about 80° C.

Figure 3E:
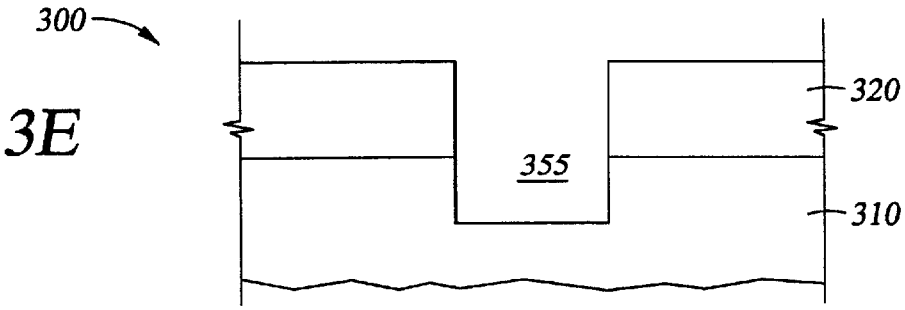

Referring back to FIG. 3D, the above described processing regime will etch the quartz material 310 to define the alternating phase shift features 345 of the photomask. The alternating phase shift features 345 formed by this process have straight sidewalls, flat, even bottoms, and high profile angles. Once the etching of the quartz material 310 is finished, the remaining resist material 340 surrounding the photomask features 355 is removed, such as by an oxygen plasma or other resist removal technique known in the art, as shown in FIG. 3E.

Precision in etching silicon based materials, such as quartz, requires controlling and minimizing the formation of polymer deposits within substrate features. One approach to achieve this precision is to control the etch process by using the hydrogen free fluorocarbon gases as described above which minimize the formation of carbon based polymer deposits that can interfere with the etching process. The reduced presence of passivating deposits during the etching process achieves features formed with relatively straight side walls, flat bottoms, and profile angles of greater than 85°, and preferably greater than 88°.

Polymer formation can be minimized by controlling the amount of fluorine and carbon radicals produced during the etching process since carbon and fluorine radicals have been observed to have different effects on the etching process. For example, fluorine radicals are highly reactive and increase the etching rate of the silicon and silicon based materials by forming volatile $SiF_x$ radicals. Carbon radicals, such as the $CF_2$ radical, tend to polymerize and form deposits on the surfaces of the features during the etching process, which deposits can interfere in the etching process and form defects in the etched feature.

It is believed that minimization of the formation of hydrogen containing carbon radicals, for example CHF from $CHF_3$, reduces the presence of readily available polymerizable species in the plasma. Hydrogen containing carbon radicals have a greater tendency than hydrogen free carbon radicals to form deposits on the surface of a substrate. Additionally, polymer deposits formed from hydrogen containing carbon radicals are less reactive than hydrogen free deposits and are more difficult to remove from the surface of a substrate by traditional etching processes. Moreover, it is believed that avoiding the formation of hydrogen containing polymer deposits results in an etch rate of the silicon based material greater than the etch rate of the patterned photoresist material. Therefore, etch selectivity can be managed by controlling formation and removal of carbon-containing radicals that form polymer deposits on the substrate. The absence of hydrogen in the process gas provides increased amounts of free fluorine radicals for etching the exposed silicon based material and etching any polymer deposits formed within the features being etched, which increases the etch selectively to silicon as compared to the photoresist.

Etch selectivities of greater than one, where the rate of silicon based material removal is greater than the rate of photoresist removal, may then be produced by using hydrogen free fluorocarbon gases in etching processes. With a selectivity greater than one, an anisotropic etch occurs on the silicon based material to form the features of the photomask with minimal defects. Additionally, with minimal formation of passivating deposits or known rates of formation of passivating deposits, a known etch rate under different processing conditions can be established and consistent etching can be performed.

Additionally, inert gases added to the process gas form ionized sputtering species and may further sputter-off any formed polymer deposits on the sidewalls of the freshly etched features, thereby reducing any passivating deposits and providing a controllable etch rate. It has been observed that the inclusion of an inert gas into the processing gas provides better etching uniformity in features to help produce features with flat bottoms and smooth sidewalls. Further, the application of bias power during the etching process accelerates the speed and provides more directionality of the etching radicals with respect to the surface of the substrate, thereby producing a more anisotropic etching of the silicon based material.

Increased bias levels provide better control of the radicals as the radicals approach the substrate in a path more normal to the surface of the substrate than could be achieved in the absence of a bias power. With the path more normal to the surface of the substrate, the process can produce straighter etching of the sidewalls, particularly the bottoms of the sidewalls, and a more uniform etch of the bottoms of the features, which results in flat, even bottoms than would occur otherwise. Thereby features are etched more precisely and produce high profile angles formed between the bottom and the sidewall of the features with little or no tapering. It has been observed that high profile angles with straight side walls and flat bottoms have been achieved by applying a bias power of about 50 to about 200 watts to the substrate during the etching process.

Additionally, it is believed that controlling the processing parameters of the etching process will further provide control over the formation of polymer deposits on the substrate surface. It has been observed that an increase in source RF power levels will increase the disassociation of the processing gas and increase the formation of polymer radicals in the plasma. An increase in the formation of polymer radicals results in increased polymerization and produces greater amounts of polymer deposits on the substrate. Therefore, reduced power levels, such as between about 50 Watts and about 200 watts are used to generate sputtering species while minimizing polymer deposits.

Further, increases in the deposition pressures have been observed to increase polymerization as more material is available to be disassociated to form polymer radicals. Therefore, low chamber pressures, such as between about 2 milliTorr and about 50 milliTorr, are used to minimize polymer formation during the etching process. In one embodiment, a pressure between about 2 milliTorr and about 10 milliTorr is used during the etching process.

It is believed that the formation of polymer deposits increase with the increase in flow rates of fluorocarbon gases as more material is provided to the plasma process. The increased amount of material in the plasma allows for the increased generation of polymer radicals, which deposit as polymers on the substrate surface. A flow rate between about 25 sccm and about 100 sccm is used to further minimize polymer formation while providing an acceptable commercial etch rate. The addition of an inert gas can dilute the fluorocarbon material in the plasma, thereby providing less polymer radical formation. The additional inert gas can further increase the etching rate by the production of inert gas species which can etch the substrate surface and polymer formations formed thereon.

In another aspect of the invention, a controllable amount of hydrogen can be provided along with the processing gases to facilitate control of the etching process and to prevent overetching of features. It is contemplated that the hydrogen may be introduced by hydrogen containing fluorocarbons with low hydrogen contents, such as $C_2HF_5$ and $CHF_3$, or by free hydrogen gas to enable the formation of a controllable amount of polymer deposits to prevent over etching and the loss of the dimensions of the features. Such hydrogen introduction may be performed during the initial etch process or may be introduced at the end of the etch process when overetching of features is most likely to occur. In either case, a improved degree of control over deposit formation can be achieved than can be achieved with either non-hydrogen containing fluorocarbons or hydrogen containing fluorocarbons. The use of hydrogen on a controlled basis can, in some embodiments, obtain the precision necessary to define precisely the structures and dimensions of the photomask's quartz features including alternating phase shift structures.

The invention is further described by the following examples which are not intended to limit the scope of the claimed invention.

EXAMPLES

For the following examples, SEM photographs of the etched features were used to measure (i) the quartz etch rate, (ii) the etching selectivity ratio of the quartz etching to photoresist etching, (iii) etching rate and etching rate uniformity, and (iv) the profile angles and the straightness of sidewalls and the flatness of the bottom of the features. Etch rates were calculated by measuring the depth of the features etched in the substrates with respect to the time of the etching process. The etching selectivity ratio was calculated from the ratio of the etch rate of the quartz layers to the etch rate of the photoresist layer. The etch rate uniformity was calculated using at least 10 measured points. The profile angles were measured by conventionally known methods.
Silicon Plasma Etching

Example 1

Prior Art Chemistry

The following example was performed with hydrogen containing fluorocarbons. A substrate was prepared by depositing a 1 µm thick layer of silicon oxide on a silicon substrate. A DUV photoresist was then deposited and etched to expose the underlying substrate. The prepared substrate was then introduced into a DPS™ plasma etching chamber. A pre-cleaning step was performed on the substrate to remove processing contaminants prior to the etching process by introducing oxygen gas at a flow rate of about 30 sccm into the chamber maintained at a chamber pressure of about 10 milliTorr and striking a plasma at about 200 Watt for about 60 seconds. The substrate was then etched at a chamber pressure of about 10 milliTorr by introducing a processing gas comprising $CHF_3$, at a flow rate of about 25 sccm, and oxygen, at a flow rate of about 3 sccm, into the chamber and applying a source power to the coil of about 100 Watts and a bias power to the substrate of approximately 200 watts for about 300 seconds. The substrate was then removed and SEM photographs of approximately 25 etched features, 10 vias and 15 line patterns, were taken and examined as explained above and the results are shown in Table 1 below.

Example 2

Silicon Oxide Etching by Hydrogen Free Fluorocarbon Gases

A substrate was prepared by depositing a 1 µm thick layer of silicon oxide on a silicon substrate. A DUV photoresist was then deposited and etched to expose the underlying substrate. The prepared substrate was then introduced into a DPS™ plasma etching chamber. A pre-cleaning step was performed on the substrate to remove processing contaminants prior to the etching process by introducing oxygen gas at a flow rate of about 30 sccm into the processing chamber maintained at a chamber pressure of about 10 milliTorr and striking a plasma at about 200 Watt for about 60 seconds. The substrate was then etched at a chamber pressure of about 10 milliTorr by introducing $C_2F_6$ into the chamber at a flow rate of about 25 sccm and applying a source power to the coil of about 100 Watts and a bias power to the substrate of approximately 200 watts for about 300 seconds. The substrate was then removed and SEM photographs of approximately 25 etched features, 10 vias and 15 line patterns, were taken and examined as in Example 1. The results of the examination of the SEM photographs of the substrates of Examples 1 and 2 are shown in Table 1 below.

TABLE 1

Etch Performance for Examples 1 and 2.

|  | Example 1: $CHF_3/O_2$ | Example 2: $C_2F_6$ |
| --- | --- | --- |
| Profile Angle | 85°–88° | 87°–89° |
| Etch Rate, Å/min | 230 | 270 |
| Resist to Quartz Selectivity | 1.4:1 | 1.3:1 |
| Uniformity | 1.0 to 3.0% | 0.5 to 1.5% |

For Examples 1 and 2, the hydrogen free fluorocarbon etching process described herein produced improved etching control with a higher profile angles, sharper feature formation, and improved uniformity at a higher etch rate while having a selectivity comparable to the prior art chemistry and processing conditions.
Production of Alternating Phase Shift Masks

Example 3

Etching by Prior Art Chemistry

A substrate was prepared as follows. A chromium layer of approximately 100 nm was deposited on a layer of optical quality quartz. A DUV photoresist was then deposited and patterned on the chromium layer, and the chromium layer was etched to expose the underlying quartz material. The DUV photoresist was removed and another DUV photoresist layer was applied and patterned to expose the underlying quartz material. The prepared substrate was then introduced into a DPS™ metal etch chamber. A pre-cleaning step was performed on the substrate to remove any errors in photoresist etching, such as rounding at the bottom of the features formed in the photoresist material during the photoresist etching process, prior to etching the quartz layer.

The substrate was etched using a prior art chemistry by introducing $CHF_3$, at a flow rate of about 25 sccm, and oxygen, at a flow rate of about 3 sccm, into the processing chamber maintained at a chamber pressure of about 2 milliTorr, and applying a source power from the coil of about 50 Watts and a bias power to the substrate of about 100 watts for about 600 seconds. The substrate was then removed and SEM photographs of approximately 25 etched features, 10 vias and 15 line patterns, were taken and examined as explained above and the results are shown in Table 2 below.

Example 4

Etching by Hydrogen Free Fluorocarbon Gases

Example 4 was performed according to the process of Example 3 with the modification of the composition of the processing gas and the modification of the plasma and bias power applied to the processing gas. The substrate was etched by introducing $C_2F_6$ into the chamber at a flow rate of about 25 sccm to achieve a chamber pressure of about 2 milliTorr and applying a source power to the coil of about 100 Watts and a bias power to the substrate of about 200 watts for about 600 seconds. The substrate was then removed and SEM photographs of approximately 25 etched features, 10 vias and 15 line patterns were taken and examined as explained above and the results are shown in Table 2 below.

Example 5

Etching by Hydrogen Free Fluorocarbon Gases

Example 5 was performed according to the process of Example 3 with the modification of the plasma and bias power applied to the processing gas. The substrate was etched by introducing $C_2F_6$ into the chamber at a flow rate of about 25 sccm to achieve a chamber pressure of about 2 milliTorr and applying a source power to the coil of about 50 Watts and a bias power to the substrate of about 100 watts for about 600 seconds. After etching, the substrate was then removed and SEM photographs of approximately 25 etched features, 10 vias and 15 line patterns were taken and examined as explained above. The etching results of Examples 3, 4, and 5 are shown in Table 2 below.

TABLE 2

Etch Performance for Examples 3, 4, and 5.

|  | Ex. 3: $CHF_3/O_2$ | Ex. 4: $C_2F_6$ | Ex. 5: $C_2F_6$ |
| --- | --- | --- | --- |
| Profile Angle | 88° | 87° | 86° |
| Etch Rate, nm/min | 27 | 69 | 28 |
| Uniformity Error | 3.0 | 1.6 | 1.9 |

For Examples 3, 4, and 5, the hydrogen free fluorocarbon etching process produced good profile control with high profile angles and sharp feature formation than the prior art chemistry and processing conditions. Additionally, the hydrogen free fluorocarbon etching process has less uniformity error and exhibited reduced defect density in comparison the $CHF_3/O_2$ chemistry. The experimental data from Table 2 and the observations of the SEM photographs of the processed substrates indicate the hydrogen free fluorocarbon gases produce substrate features with high profile angles, straight vertical sidewalls, flat feature bottoms, and a lower defect density.

While foregoing is directed to the preferred embodiment of the invention, other and further embodiments of the invention may be devised without departing from the basic scope thereof, and the scope thereof is determined by the claims that follow.

What is claimed is:

1. A method for etching a reticle, comprising:
    placing the reticle on a support member in a processing chamber, wherein the reticle comprises an optically transparent material and is maintained at a temperature of about 150° C. or less;
    introducing a processing gas comprising one or more hydrogen free fluorocarbons into the processing chamber;
    delivering power to the processing chamber to generate a plasma by supplying a source RF power of about 200 Watts or less to a coil and supplying a bias power to the support member of about 200 Watts or less; and
    etching exposed portions of the optically transparent material.

2. The method of claim 1, wherein the optically transparent material is selected from the group of quartz ($SiO_2$), molybdenum silicide (MoSi), molybdenum silicon oxynitride (MoSiON), and combinations thereof.

3. The method of claim 1, wherein the one or more hydrogen free fluorocarbons have the formula $C_xF_y$, where x is an integer from 1 to 5 and y is an integer from 4 to 8.

4. The method of claim 1, wherein the one or more hydrogen free fluorocarbons are selected from the group of $CF_4$, $C_2F_6$, $C_4F_6$, $C_3F_8$, $C_4F_8$, $C_5F_8$, and combinations thereof.

5. The method of claim 1, wherein the source RF power is between about 50 Watts and about 200 Watts and the bias power is between about 50 Watts and about 200 Watts.

6. The method of claim 1, wherein the processing chamber is maintained at a pressure between about 2 milliTorr and about 50 milliTorr.

7. The method of claim 1, wherein the processing gas further comprises an inert gas selected from the group of argon, helium, and combinations thereof.

8. The method of claim 7, wherein the one or more hydrogen free fluorocarbons are introduced into the chamber at a flow rate between about 25 sccm and about 100 sccm, and the inert gas is introduced into the processing chamber at a flow rate between about 30 sccm and about 150 sccm.

9. The method of claim 1, wherein one or more hydrogen free fluorocarbons having the formula $C_xF_y$ are introduced into the processing chamber at a flow rate between about 25 sccm and about 100 sccm and an inert gas is introduced into the processing chamber at a flow rate between about 30 sccm and about 150 sccm, and further comprising generating a plasma in the processing chamber maintained at a pressure between about 2 milliTorr and about 50 milliTorr with the reticle maintained at a temperature between about 50° C. and about 150° C. by supplying a RF power between about 50 watts and 200 watts and supplying a bias power to the support member between about 50 Watts and about 200 Watts.

10. A method for etching a reticle comprising an optically transparent material and a patterned metal layer disposed thereon, the method comprising:
    placing the reticle in a processing chamber on a support member, wherein the reticle is maintained at a temperature of less than about 150° C.;
    introducing a processing gas comprising one or more fluorocarbons having the formula $C_xF_y$ into the processing chamber, where x is an integer from 1 to 5 and y is an integer from 4 to 8;
    delivering power to the processing chamber to generate a plasma; and
    etching exposed portions of the optically transparent material.

11. The method of claim 10, wherein the optically transparent material is selected from the group of quartz ($SiO_2$), molybdenum silicide (MoSi), molybdenum silicon oxynitride (MoSiON), and combinations thereof.

12. The method of claim 10, wherein the one or more fluorocarbons having the formula $C_xF_y$ are selected from the group of $CF_4$, $C_2F_6$, $C_4F_6$, $C_3F_8$, $C_4F_8$, $C_5F_8$, and combinations thereof.

13. The method of claim 10, wherein the delivering power to the processing chamber comprises supplying a source RF power of about 200 Watts or less to a coil and supplying a bias power to the support member of about 200 Watts or less to generate a plasma.

14. The method of claim 13, wherein the source RF power is supplied at between about 50 Watts and about 200 Watts.

15. The method of claim 13, wherein the bias power is supplied to the support member at between about 50 Watts and about 200 Watts.

16. The method of claim 10, wherein the processing chamber is maintained at a pressure between about 2 milliTorr and about 50 milliTorr.

17. The method of claim 10, wherein the processing gas further comprises an inert gas selected from the group of argon, helium, and combinations thereof.

18. The method of claim 17, wherein the one or more fluorocarbons are introduced into the chamber at a flow rate between about 25 sccm and about 100 sccm and the inert gas is introduced into the processing chamber at a flow rate between about 30 sccm and about 150 sccm.

19. The method of claim 10, wherein the reticle is maintained at a temperature between about 50° C. and about 150° C.

20. The method of claim 10, wherein the one or more fluorocarbons having the formula $C_xF_y$, are introduced into the processing chamber at a flow rate between about 25 sccm and about 100 sccm and an inert gas is introduced into the processing chamber at a flow rate between about 30 sccm and about 150 sccm, and further comprising generating a plasma in the processing chamber maintained at a pressure between about 2 milliTorr and about 50 milliTorr with the reticle maintained at a temperature between about 50° C. and about 150° C. by supplying a RF power between about 50 watts and 200 watts and supplying a bias power to the support member between about 50 Watts and about 200 Watts.

21. A method for etching a reticle comprising an optically transparent material, a patterned metal layer deposited on the optically transparent material, and a patterned resist material deposited on the patterned metal layer, the method comprising:

placing the reticle on a support member in a processing chamber;

introducing a processing gas comprising one or more hydrogen free fluorocarbon gases;

delivering power to the processing chamber by supplying a source RF power of about 200 Watts or less to a coil and supplying a bias power to the support member of about 200 Watts or less to generate a plasma; and etching exposed portions of the optically transparent material.

22. The method of claim 21, wherein the optically transparent material is selected from the group of quartz ($SiO_2$), molybdenum silicide (MoSi), molybdenum silicon oxynitride (MoSiON), and combinations thereof.

23. The method of claim 21, wherein the one or more hydrogen free fluorocarbon gases have the formula $C_xF_y$, where x is an integer from 1 to 5 and y is an integer from 4 to 8.

24. The method of claim 23, wherein the one or more hydrogen free fluorocarbon gases are selected from the group of $CF_4$, $C_2F_6$, $C_4F_6$, $C_3F_8$, $C_4F_8$, $C_5F_8$, and combinations thereof.

25. The method of claim 21, wherein the processing gas further comprises an inert gas selected from the group of argon, helium, and combinations thereof.

26. The method of claim 35, wherein the one or more hydrogen-free fluorocarbon gases are introduced into the chamber at a flow rate between about 25 sccm and about 50 sccm, and the inert gas is introduced into the processing chamber at a flow rate between about 30 sccm and about 50 sccm.

27. The method of claim 21, wherein reticle temperature is maintained between about 50° C. and about 150° C.

28. The method of claim 21, wherein the processing chamber is maintained at a pressure between about 2 milliTorr and about 10 milliTorr.

29. The method of claim 21, wherein the one or more hydrogen free fluorocarbon gases are introduced into the processing chamber at a flow rate between about 25 sccm and about 100 sccm and an inert gas is introduced into the processing chamber at a flow rate between about 30 sccm and about 150 sccm, and further comprising maintaining the processing chamber at a pressure between about 2 milliTorr and about 50 milliTorr and maintaining the reticle at a temperature between about 50° C. and about 150° C. while a plasma is generated by supplying a RF power between about 50 watts and 200 watts and supplying a bias power to the support member between about 50 Watts and about 200 Watts.

30. A method for fabricating a photomask comprising an optically transparent material, comprising:

patterning a metal layer over the optically transparent material;

patterning a photoresist layer over the metal layer;

placing the photomask on a support member in an etch processing chamber;

maintaining the photomask at a temperature of about 150° C. or less;

introducing a processing gas comprising one or more hydrogen free fluorocarbons into the processing chamber;

supplying a source of RF power to generate a plasma in the processing chamber; and etching exposed portions of the optically transparent material.

31. The method of claim 30, wherein the optically transparent material is selected from the group of quartz ($SiO_2$), molybdenum silicide (MoSi), molybdenum silicon oxynitride (MoSiON), and combinations thereof.

32. The method of claim 30, wherein the one or more hydrogen free fluorocarbon gases have the formula $C_xF_y$, where x is an integer from 1 to 5 and y is an integer from 4 to 8.

33. The method of claim 30, wherein the one or more hydrogen free fluorocarbon gases are selected from the group of $CF_4$, $C_2F_6$, $C_4F_6$, $C_3F_8$, $C_4F_8$, $C_5F_8$, and combinations thereof.

34. The method of claim 30, wherein the processing gas further comprises an inert gas selected from the group of argon, helium, and combinations thereof.

35. The method of claim 30, wherein the source RF power is delivered at between about 50 Watts and about 200 Watts.

36. The method of claim 30, further comprising supplying a bias power to the support member of about 200 Watts or less.

37. The method of claim 30, further comprising supplying a bias power to the support member between about 50 Watts and about 200 Watts.

38. The method of claim 30, wherein the processing chamber is maintained at a pressure between about 2 milliTorr and about 10 milliTorr.

39. The method of claim 34, wherein $C_2F_6$ is introduced into the chamber at a flow rate between about 25 sccm and about 50 sccm, and the inert gas is introduced into the processing chamber at a flow rate between about 30 sccm and about 50 sccm.

40. The method of claim 30, wherein the processing gas comprising $CF_4$, $C_2F_6$, $C_4F_6$, $C_3F_8$, $C_4F_8$, $C_5F_8$, or combinations thereof, is introduced into the processing chamber at a flow rate between about 25 sccm and about 100 sccm and an inert gas is introduced into the processing chamber at a flow rate between about 30 sccm and about 150 sccm, and further comprising maintaining the processing chamber at a pressure between about 2 milliTorr and about 50 milliTorr and maintaining the reticle at a temperature between about 50° C. and about 150° C. while a plasma is generated by supplying a RF power between about 50 watts and 200 watts and supplying a bias power to the support member between about 50 Watts and about 200 Watts.

* * * * *